United States Patent
Pearson

(10) Patent No.: US 8,742,747 B2
(45) Date of Patent: *Jun. 3, 2014

(54) DETECTOR FOR DETECTING A CURRENT CARRYING CONDUCTOR

(75) Inventor: Richard David Pearson, Bristol (GB)

(73) Assignee: Radiodetection Limited, Bristol (GB)

( * ) Notice: Subject to any disclaimer, the term of this patent is extended or adjusted under 35 U.S.C. 154(b) by 639 days.

This patent is subject to a terminal disclaimer.

(21) Appl. No.: 12/961,401

(22) Filed: Dec. 6, 2010

(65) Prior Publication Data

US 2012/0139525 A1    Jun. 7, 2012

(51) Int. Cl.
*G01R 19/00*    (2006.01)

(52) U.S. Cl.
USPC .................................................. 324/67

(58) Field of Classification Search
USPC ............................... 324/67; 702/38
See application file for complete search history.

(56) References Cited

U.S. PATENT DOCUMENTS

| | | | | |
|---|---|---|---|---|
| 3,617,865 A | * | 11/1971 | Hakata | 324/326 |
| 4,005,421 A | * | 1/1977 | Dax | 342/148 |
| 4,295,095 A | * | 10/1981 | Thomas et al. | 324/326 |
| 5,093,622 A | * | 3/1992 | Balkman | 324/326 |
| 5,194,812 A | * | 3/1993 | Yokoi | 324/326 |
| 6,411,073 B1 | * | 6/2002 | Fischer et al. | 324/66 |
| 6,586,937 B2 | * | 7/2003 | Goodman | 324/326 |
| 7,113,124 B2 | * | 9/2006 | Waite | 342/22 |
| 7,120,564 B2 | * | 10/2006 | Pacey | 702/193 |
| 7,164,270 B1 | * | 1/2007 | Chen et al. | 324/326 |
| 7,356,421 B2 | * | 4/2008 | Gudmundsson et al. | 702/38 |
| 8,183,851 B2 | * | 5/2012 | Royle et al. | 324/67 |
| 8,566,043 B2 | * | 10/2013 | Royle et al. | 702/57 |
| 2004/0150387 A1 | * | 8/2004 | Lyon et al. | 324/127 |
| 2005/0248333 A1 | * | 11/2005 | Schlapp et al. | 324/67 |
| 2006/0036376 A1 | * | 2/2006 | Gudmundsson et al. | 702/38 |
| 2009/0009410 A1 | * | 1/2009 | Dolgin et al. | 343/703 |
| 2011/0057650 A1 | * | 3/2011 | Hellwig et al. | 324/252 |

FOREIGN PATENT DOCUMENTS

EP        2098888 A2 *   9/2009   ............... G01V 3/08

* cited by examiner

*Primary Examiner* — Benjamin M Baldridge

(74) *Attorney, Agent, or Firm* — Baker & Hostetler LLP

(57) ABSTRACT

A locator for determining the location and/or orientation of a concealed conductor, comprising a reference field detector operable to detect an alternating magnetic field along a reference axis; a first field detector operable to detect an alternating magnetic field along a first axis; and a processor operable to calculate an in-phase component of a signal detected by the first field detector, the in-phase component being in phase with a signal detected at the reference field detector and to calculate a signal indicative of a position of the concealed conductor relative to the locator using at least the in-phase component.

20 Claims, 17 Drawing Sheets

DETECTOR FOR DETECTING A CURRENT CARRYING CONDUCTOR

FIELD OF THE INVENTION

The present invention relates to a detector for locating and/or determining the orientation of a concealed conductor.

BACKGROUND OF THE INVENTION

Before commencing excavation or other work where electrical cables, fiber optic cables or other utilities ducts or pipes are buried, it is important to determine the location of such buried cables or pipes to ensure that they are not damaged during the work. Once a buried utility is located the depth of the utility can be calculated to determine a safe excavation depth.

Current carrying conductors emit electromagnetic radiation which can be detected by an electrical antenna. If fiber optic cables or non-metallic utilities ducts or pipes are fitted with a small electrical tracer line, an alternating electrical current can be coupled into the tracer line which in turn radiates electromagnetic radiation. It is known to use detectors to detect the electromagnetic field emitted by conductors carrying alternating current.

One type of such detector works in one of two modes, namely 'active' or 'passive' modes. Each mode has its own frequency bands of detection.

The passive mode comprises 'power' mode and 'radio' mode. In power mode, the detector detects the magnetic field produced by a conductor carrying an AC mains power supply at 50/60 Hz, or the magnetic field re-radiated from a conductor as a result of a nearby cable carrying AC power, together with higher harmonics up to about 5 KHz. In radio mode, the detector detects very low frequency (VLF) radio energy which is re-radiated by buried conductors. The source of the original VLF radio signals is a plurality of VLF long wave transmitters, both commercial and military.

In the active mode, a signal transmitter produces an alternating current of known frequency and modulation, which couples a signal current into a nearby buried conductor. The signal transmitter may be directly connected to the conductor or, where direct connection access is not possible, a signal transmitter may be placed near to the buried conductor and a signal current may be induced in the conductor. The buried conductor re-radiates the signal produced by the signal transmitter.

This invention provides further advancements to existing systems for locating and or determining the orientation of concealed current carrying conductors, providing additional functionality and benefits to the user.

SUMMARY OF THE INVENTION

According to an embodiment of the present invention there is provided a locator for determining the location and/or orientation of a concealed conductor, the locator comprising a reference field detector operable to detect an alternating magnetic field along a reference axis; a first field detector operable to detect an alternating magnetic field along a first axis; and a processor operable to calculate an in-phase component of a signal detected by the first field detector, the in-phase component being in phase with a signal detected at the reference field detector and to calculate a signal indicative of a position of the concealed conductor relative to the locator using at least the in-phase component.

In one embodiment of the present invention the locator further comprises a reference oscillator and the processor is further operable to calculate vectors for the signal from the reference detector and first field detector, and to calculate a projection of the vector from first detector onto the vector from the reference oscillator as the in-phase component.

The first axis may be parallel to the reference axis, the first field detector and the reference field detector spaced apart, and the processor operable to calculate the distance between the concealed conductor and the locator.

According to one embodiment of the present invention the first axis is at an angle to the reference axis, and the processor is operable to calculate the signal to indicate the degree of rotation of the reference axis relative to an axis of the concealed conductor.

According to one embodiment of the present invention the first axis is orthogonal to the reference axis.

According to one embodiment of the present invention the first axis is at an angle to the reference axis, and the processor is operable to calculate the signal to indicate a lateral position of the conductor relative to the first axis.

According to one embodiment of the present invention the first axis is orthogonal to the reference axis.

According to one embodiment of the present invention the locator further comprises a further field detector operable to detect an alternating magnetic field along a second axis, wherein the second axis is parallel to the first axis, the first axis and the second axis are orthogonal to the reference axis, and the processor is operable to calculate the signal to indicate a lateral displacement between the first axis and the concealed conductor.

According to one embodiment of the present invention the locator further comprises an indicator for providing an indication of the position and/or orientation of the concealed conductor using the signal indicative of the position and/or orientation of the concealed conductor relative to the locator.

According to another embodiment of the present invention, there is provided a method of determining the location and/or orientation of a concealed conductor, the method comprising measuring a reference magnetic field along a reference axis; measuring a first magnetic field along a first axis; calculating an in-phase component of the first magnetic field, the in-phase component being in phase with the reference magnetic field; and calculating position and/or orientation information of the concealed conductor using at least the in-phase component.

According to one embodiment of the present invention the first axis is parallel to the reference axis, and the position information comprises a distance between the reference axis and the concealed conductor.

According to one embodiment of the present invention the first axis is at an angle to the reference axis and the position information comprises a lateral position of the conductor relative to the first axis.

According to one embodiment of the present invention the first axis is orthogonal to the reference axis.

According to one embodiment of the present invention, the method further comprises measuring a second magnetic field along a second axis, wherein the second axis is parallel to the first axis, the first axis and the second axis are orthogonal to the reference axis, and the position information comprises a lateral distance between the first axis and the concealed conductor.

According to one embodiment of the present invention the first axis is at an angle to the reference axis, and the orientation information comprises an indication of the degree of rotation of the reference axis relative to an axis of the concealed conductor.

According to one embodiment of the present invention the first axis is orthogonal to the reference axis According to one embodiment of the present invention the method further comprises generating a reference oscillation, calculating the phase of the reference field with respect to the reference oscillation, calculating the phase of the first magnetic field with respect to the reference oscillation, and determining the in-phase component from the calculated phases and magnitudes of the reference magnetic field and the first magnetic field.

According to a further embodiment of the present invention there is provided a carrier medium carrying computer readable instructions for execution by a processor in a locator for locating and/or determining orientation of a concealed conductor, the locator having a reference field detector operable to detect an alternating magnetic field along a reference axis; a first field detector operable to detect an alternating magnetic field along a first axis; wherein the instructions comprise instructions for controlling the processor to calculate an in-phase component of a signal detected by the first field detector, the in-phase component being in phase with a signal detected at the reference field detector and to calculate a signal indicative of a position and/or orientation of the concealed conductor relative to the locator using at least the in-phase component.

According to one embodiment of the present invention, the instructions further comprise instructions for calculating the phase of the reference field with respect to a reference oscillation, calculating the phase of the first magnetic field with respect to the reference oscillation, and determining the in-phase component from the calculated phases and magnitudes of the reference magnetic field and the first magnetic field.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1A:
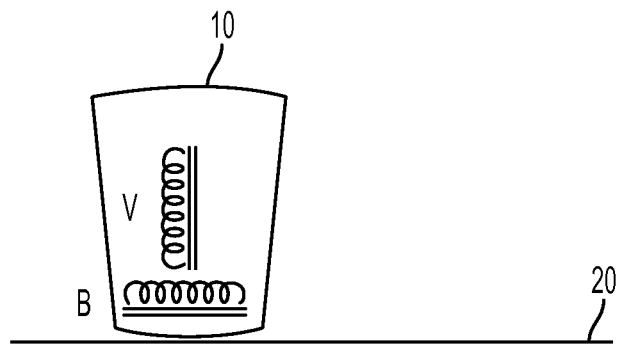
FIG. 1A shows a schematic view of a locator for locating concealed conductors according to an embodiment of the present invention.
Figure 1A:
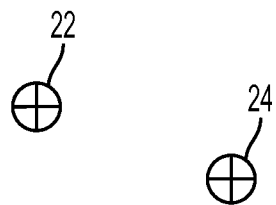

The invention will now be described with reference to the drawing figures, in which like reference numerals refer to like parts throughout.

FIG. 1A shows a schematic view of a locator 10 for locating concealed conductors according to an embodiment of the present invention. The locator has a bottom magnetic field sensor B which is horizontally orientated and a second magnetic field sensor V which is vertically orientated. FIG. 1A shows the ground level 20 and a target conductor 22 buried beneath the ground. There is a further conductor 24 buried beneath the ground. Both conductors 22 and 24 carry an alternating current and therefore emit a magnetic field. The alternating current in the conductor 24 may be a bleed-off or bleed-over signal induced by the signal in conductor 22. Because of the nature of the coupling of the signals in the conductors 22 and 24, there is a phase difference in the alternating current signals.

The presence of the signal from conductor 24 results in the signals detected by the detectors B and V in the locator 10 being distorted from those which exist when a single conductor carrying an alternating current is present. This decreases the accuracy with which the position of conductor 22 can be determined.

Magnetic field sensor B detects the magnetic field from conductors 22 and 24. Because magnetic field sensor B is orientated horizontally, there is strong coupling between the magnetic field from the signal in conductor 22, which follows a cylindrical pattern around conductor 22. Because of the lateral distance and angle subtended between conductor 24 and locator 10, the coupling between the field inducted by the signal in conductor 24 and magnetic field sensor B is small in comparison. As a result of this, the phase of the signal detected by magnetic field sensor B will be close to the phase of the field induced by the signal in conductor 22.

The field measured by magnetic field sensor V will couple strongly with the fields from both conductor 22 and conductor 24. In order to reduce the effect of the field from conductor 24 on calculations of the position of conductor 22, the locator 10 resolves components of the signal from sensor V that are in phase with the signal from sensor B. This reduces the effect that the presence of the field from the signal in conductor 24 has on the calculations of the position of the conductor 22.

The orientation of the magnetic field detectors used shown in FIG. 1A can be used to determine the lateral position of the target conductor with respect to the locator.

Figure 1B:
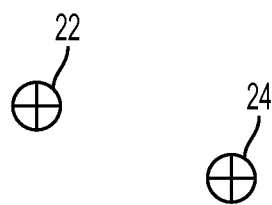
FIG. 1B shows a schematic view of a locator for locating concealed conductors according to an embodiment of the present invention.

The arrangement of coils shown in FIG. 1B can be used to determine the depth of a concealed conductor from the difference in field measure at the top magnetic field sensor T and the bottom magnetic field sensor B. This method is described in detail in US Patent Application no. 2010/0004880, the contents of which are incorporated herein by reference. By calculating the in-phase component of the signal measured at T with respect to the signal measured by the bottom sensor B, the accuracy of the depth calculation is increased in situations where bleedover signals are present in adjacent conductors.

Figure 1C:
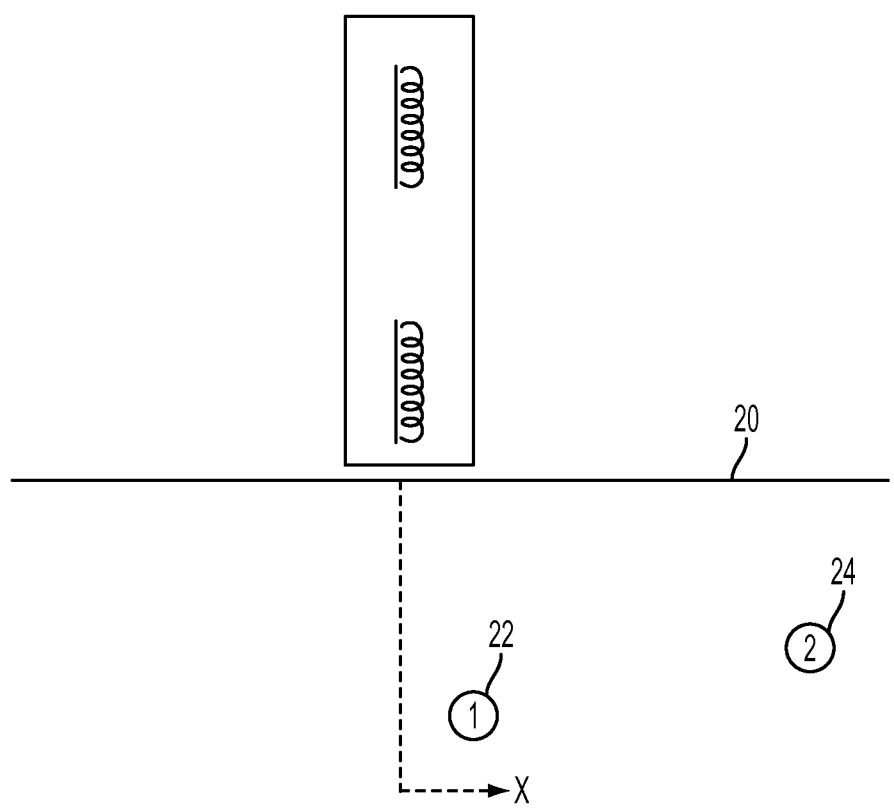
FIG. 1C shows a schematic view of a locator for locating concealed conductors according to an embodiment of the present invention.

FIG. 1C shows a schematic view of a locator 10 for locating concealed conductors. FIG. 1C shows the ground level 20 and a target conductor 22 buried beneath the ground. There is a further conductor 24 buried beneath the ground. Both conductors 22 and 24 carry an alternating current and therefore emit a magnetic field. There may be coupling between the conductors 22 and 24 for example resistive coupling which would result in the alternating currents in the two conductors being in phase. The locator 10 has a bottom vertical magnetic field sensor $V_b$ and a top vertical magnetic field sensor $V_t$. The magnetic field sensors $V_b$ and $V_t$ are located vertically above one another. The magnetic field sensors $V_b$ and $V_t$ are both operable to detect magnetic fields along the primary vertical axis of the locator.

The inclusion of two vertical magnetic field sensors in the locator 10 allows the lateral distance between the locator 10 and the target conductor 22 to be more accurately calculated in the presence of a second conductor 24 than would be the case for a locator having a single vertical magnetic field sensor. The reasons for this are described below with reference to FIGS. 2 to 4.

Figure 2:
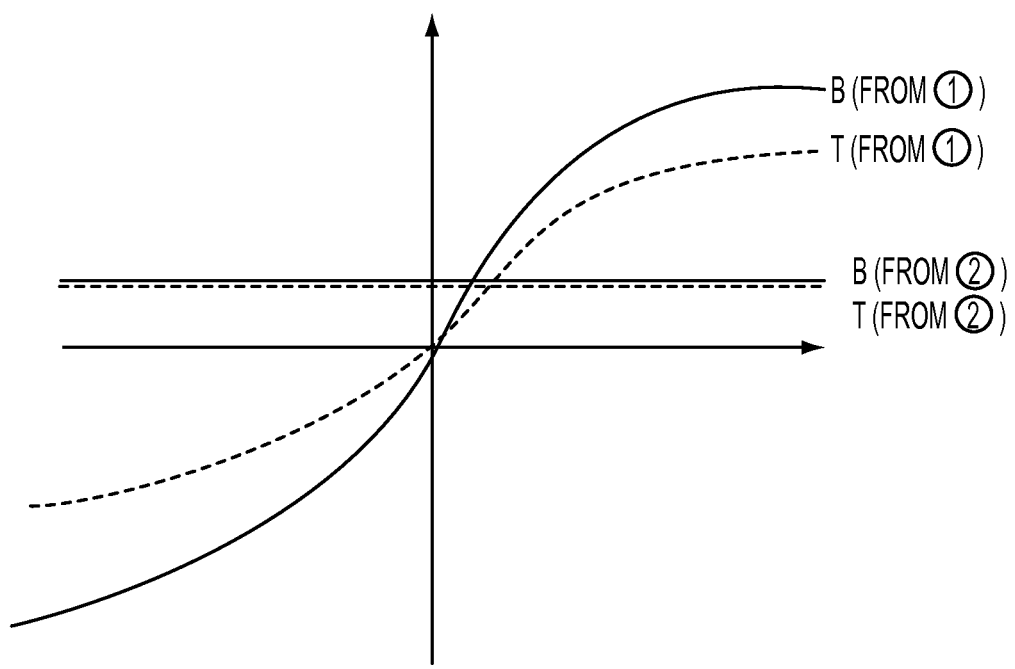
FIG. 2 shows a graph of the magnetic field amplitude and polarity detected by the locator shown in FIG. 1.

FIG. 2 shows a graph of the magnetic field amplitude and polarity detected at $V_b$ and $V_t$ from the target conductor 22 and the second conductor 24. Because the second conductor 24 is located relatively far from the locator 10 in comparison to the distance from the second conductor 24, it is assumed that the magnetic field will not vary greatly with lateral movements of the locator in the direction indicated as 'x' on FIG. 1. The amplitude of the magnetic field due to the target conductor, measured at the top sensor $V_t$ is zero when the locator is located directly above the target conductor 22 as at this point the magnetic field is perpendicular to the sensor. As the lateral distance between the locator and the target conductor 22 increases, as does the measured field amplitude this is because the component of the field in the vertical direction increases. When the locator is passed over the position of the target conductor 22, the polarity of the field reverses. The shape of the curve of the magnetic field measured in the top vertical field detector $V_t$ is similar to that of that measured by the bottom vertical field sensor $V_b$ however, the strength of the field measured is lower as the distance between the target conductor 22 and the top vertical magnetic field sensor $V_t$ is greater than the distance between the target conductor 22 and the bottom magnetic field sensor $V_b$.

Figure 3:
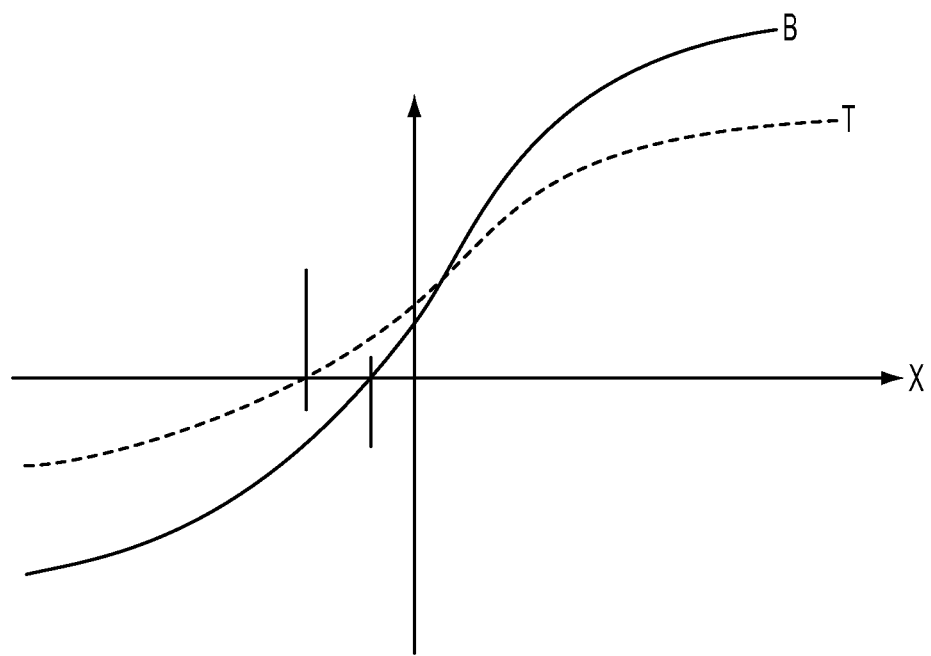
FIG. 3 shows a graph of the magnetic field amplitude and polarity detected by the locator shown in FIG. 1.

FIG. 3 shows the magnetic field measured at $V_t$ and $V_b$. This is the sum of the fields produced by the target conductor 22 and the second conductor 24. As can be seen in FIG. 3, the presence of the second conductor causes the zero, or null, of the measured magnetic field to be located at a position displaced from the true position of the target conductor. This means that systems using a single vertical coil to determine the lateral location of a target conductor are susceptible to interference from the presence of second additional conductors underground.

Figure 4:
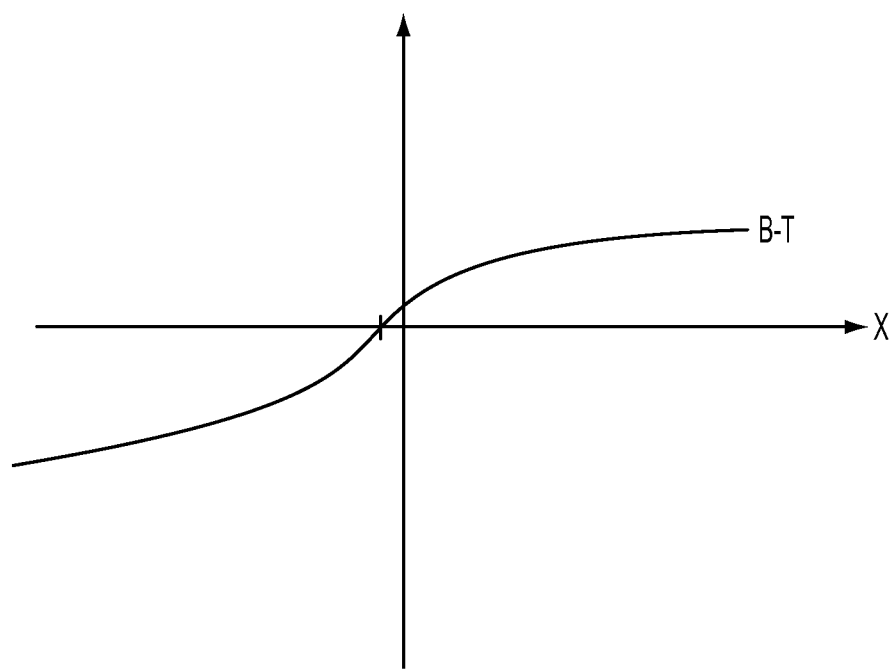
FIG. 4 shows a graph of the difference between the field measured at the bottom vertical magnetic field detector and the field measured at the top vertical magnetic field sensor of the locator shown in FIG. 1.

FIG. 4 shows a graph of the difference between the field measured at the bottom vertical magnetic field detector $V_b$ and the field measured at the top vertical magnetic field sensor $V_t$. As is apparent from FIG. 4, the use of this difference in place of either of the signals measured at either the top vertical or the bottom vertical magnetic field sensors reduces the displacement of the null and therefore allows the lateral displacement from the locator to the target conductor to be more accurately calculated.

The use of two vertical coils $V_b$ and $V_t$ means that common-mode signals from second conductors located far from the target conductor are rejected. This allows more accurate location of concealed conductors.

The above FIGS. 1 to 4 illustrate magnetic field as a signed amplitude with the polarity changing as the locator is moved from right to left. When single-frequency alternating magnetic fields are measured, it is only possible to measure signal-polarity with respect to another signal. Therefore if two coils are used, as is shown in FIG. 1, the magnitude of the magnetic field can be measured but as the polarity of all of the signals changes, it is not possible to determine an indication of the polarity of the magnetic field since a reference polarity would be required to compare the signals measured at the left hand side and the right hand side of the null in order to determine whether the locator was located to the left or to the right of the null position.

Figure 5:
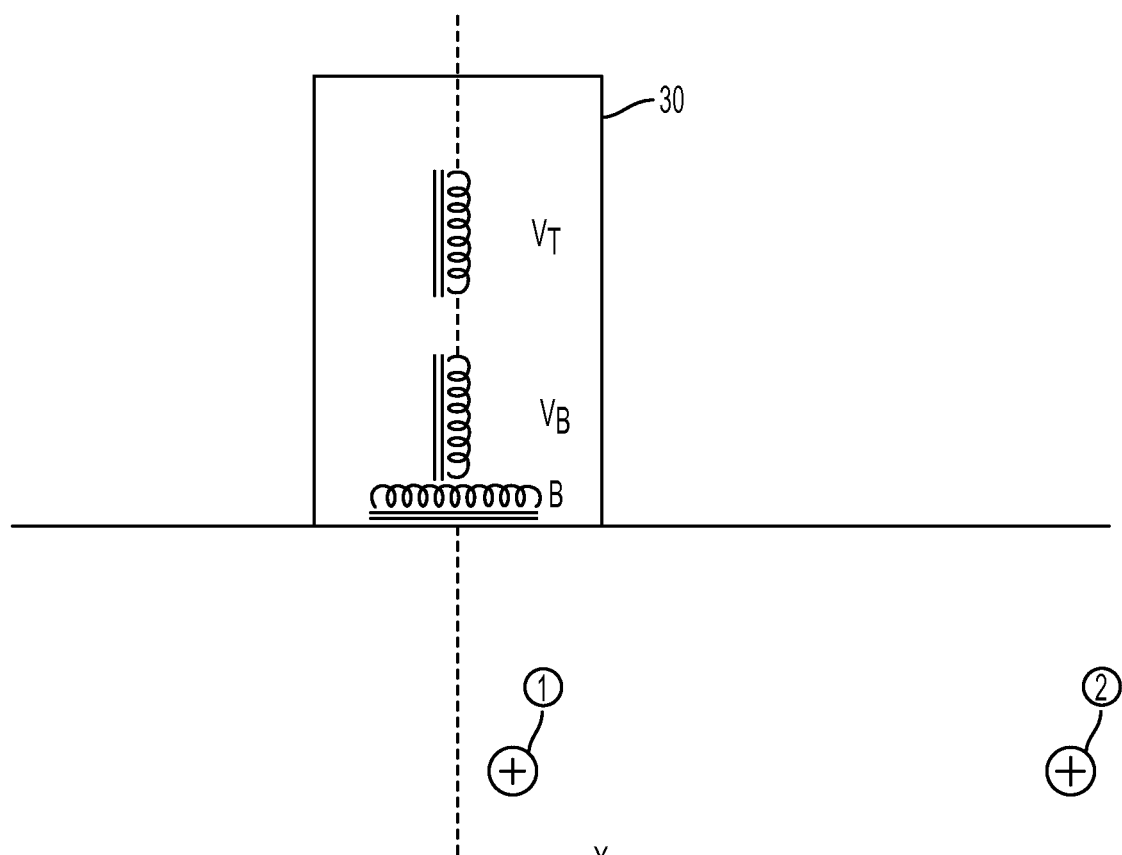
FIG. 5 shows a schematic view of a locator according to an embodiment of the present invention.

FIG. 5 shows a schematic view of a locator 30 according to an embodiment of the present invention. The locator 30 has a top vertical coil $V_t$ and a bottom vertical coil $V_b$ as was the case with the locator 10 shown in FIG. 1. The locator 30 includes an additional bottom horizontal coil B that is arranged perpendicular to the axis of the vertical coils $V_t$ and $V_b$.

Figure 6:
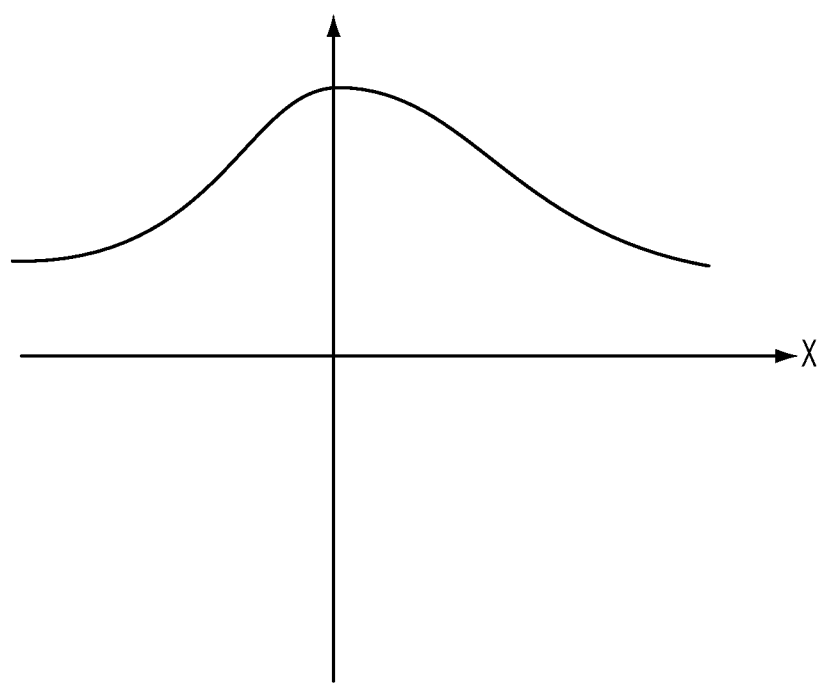
FIG. 6 shows the magnetic field amplitude detected by a sensor in the locator shown in FIG. 5.

The field detected by the detector B with respect to distance x from the concealed conductor 22 is shown in FIG. 6. The response of the detector B to the magnetic field exhibits a bell shape having a peak response when directly above the target conductor. It is noted that there is no change of polarity when detector B passes over the concealed conductor.

Because there is no change in polarity of the signal received by the bottom horizontal detector B, it is possible to use the output of detector B as a reference to determine the polarity of the difference signal between the $V_b$ and $V_t$. Information on the polarity of the difference signals allows a determination of whether the locator is to the left or to the right of the concealed conductor to be determined.

Further, the output from the horizontal coil B can be used to normalize the difference value meaning that an indication signal representing the lateral distance from the locator to the concealed conductor can be calculated such that the indication signal is invariant with the magnitude of the signal current in the concealed conductor. This function makes embodiments of the present invention particularly easy to use because a user does not have to adjust the gain of the system to account for variations in soil type and strength of the signal in the concealed conductors.

Figure 7:
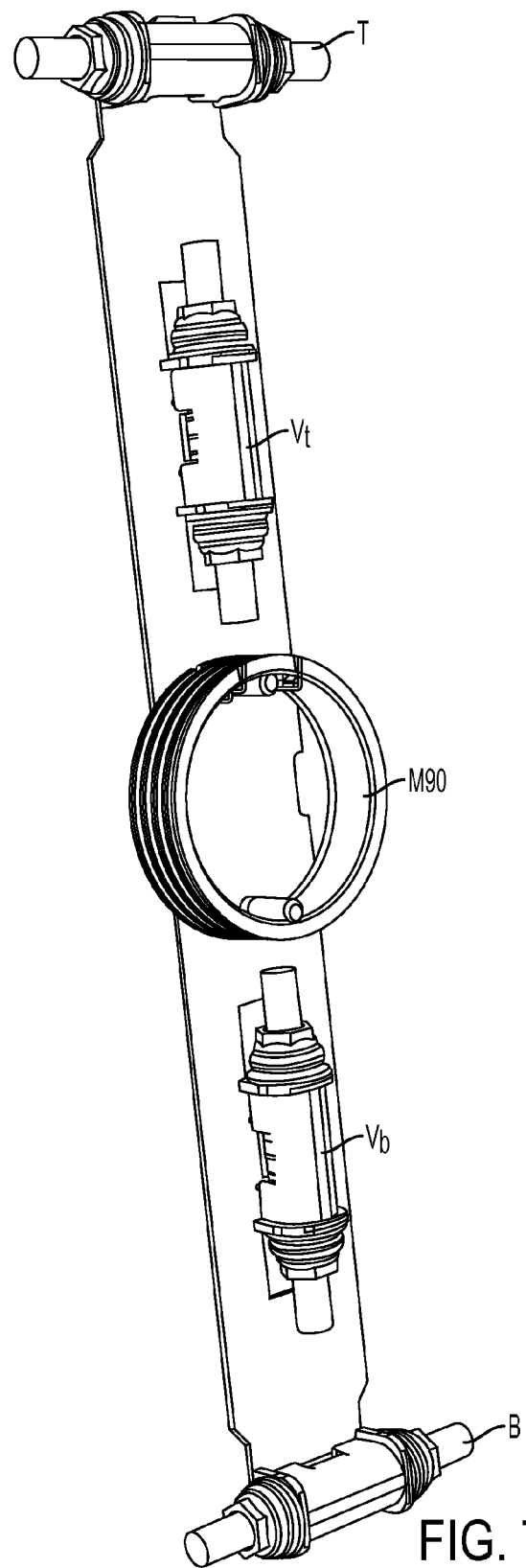
FIG. 7 shows an array of magnetic field detectors for use in a locator according to an embodiment of the present invention.

FIG. 7 shows an array of magnetic field detectors for use in a locator according to an embodiment of the present invention. The array has five magnetic field detectors arranged in a line. At the top there is a top horizontal field detector. Below the top horizontal field detector is a top vertical field detector $V_t$. Below the top vertical field detector $V_t$ is a horizontal field detector oriented in a plane orthogonal to the top horizontal field detector M90. Below the M90 field detector there is a second vertical field detector $V_b$. At the bottom of the array there is a second horizontal field detector B. The top and bottom horizontal field detectors and the vertical field detectors have ferrite cores. The M90 coil is an air-cored coil. This means that the protrusion of the M90 coil out of the plane of the array is minimized, allowing the array to be supported and protected inside a compact blade-shaped housing. An example of such a coil array is described in more detail in U.S. Pat. No. 6,268,731, the content of which is incorporated herein by reference in its entirety.

Figure 8A:
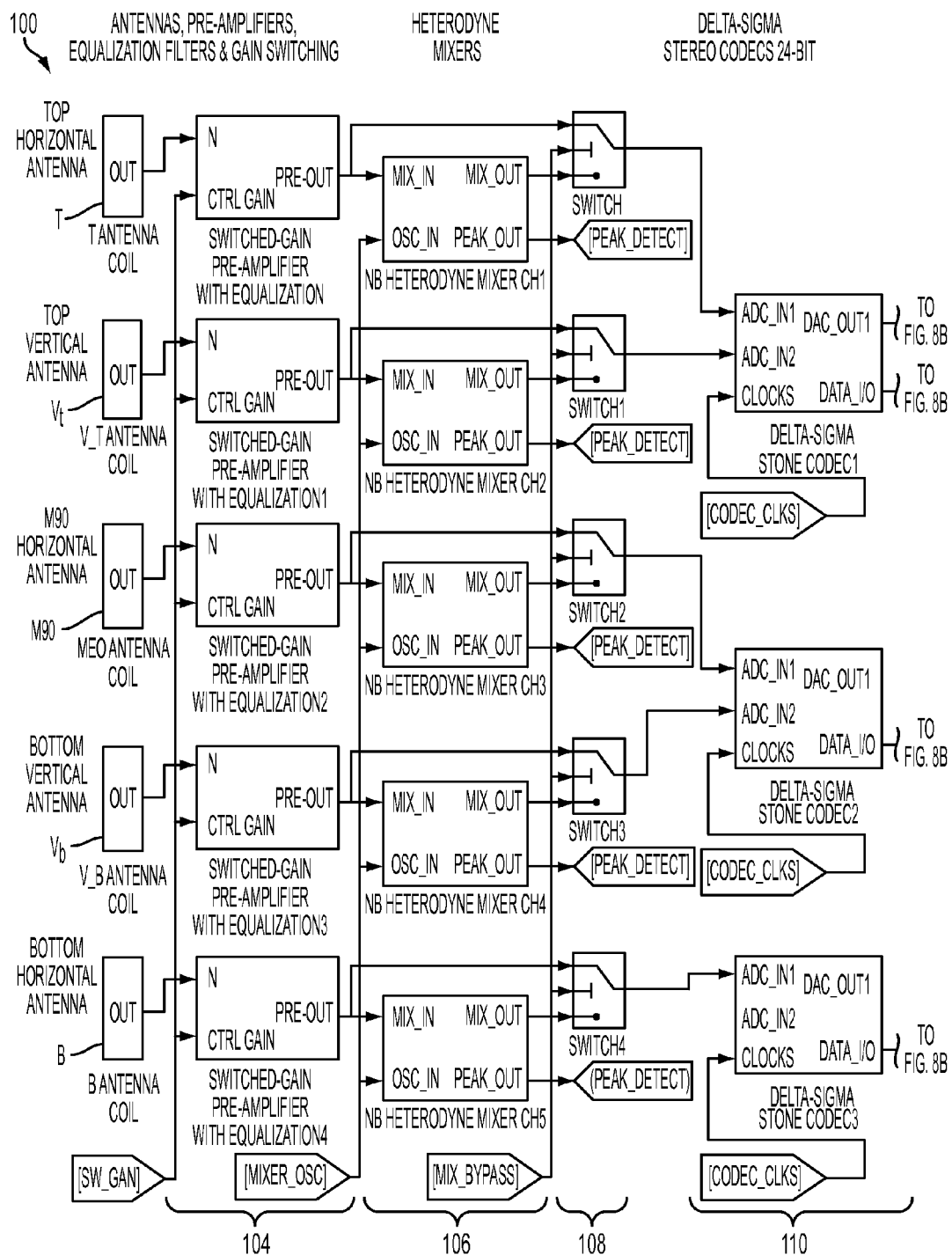
FIGS. 8A and 8B show a block diagram of a locator according to an embodiment of the present invention.
Figure 8B:
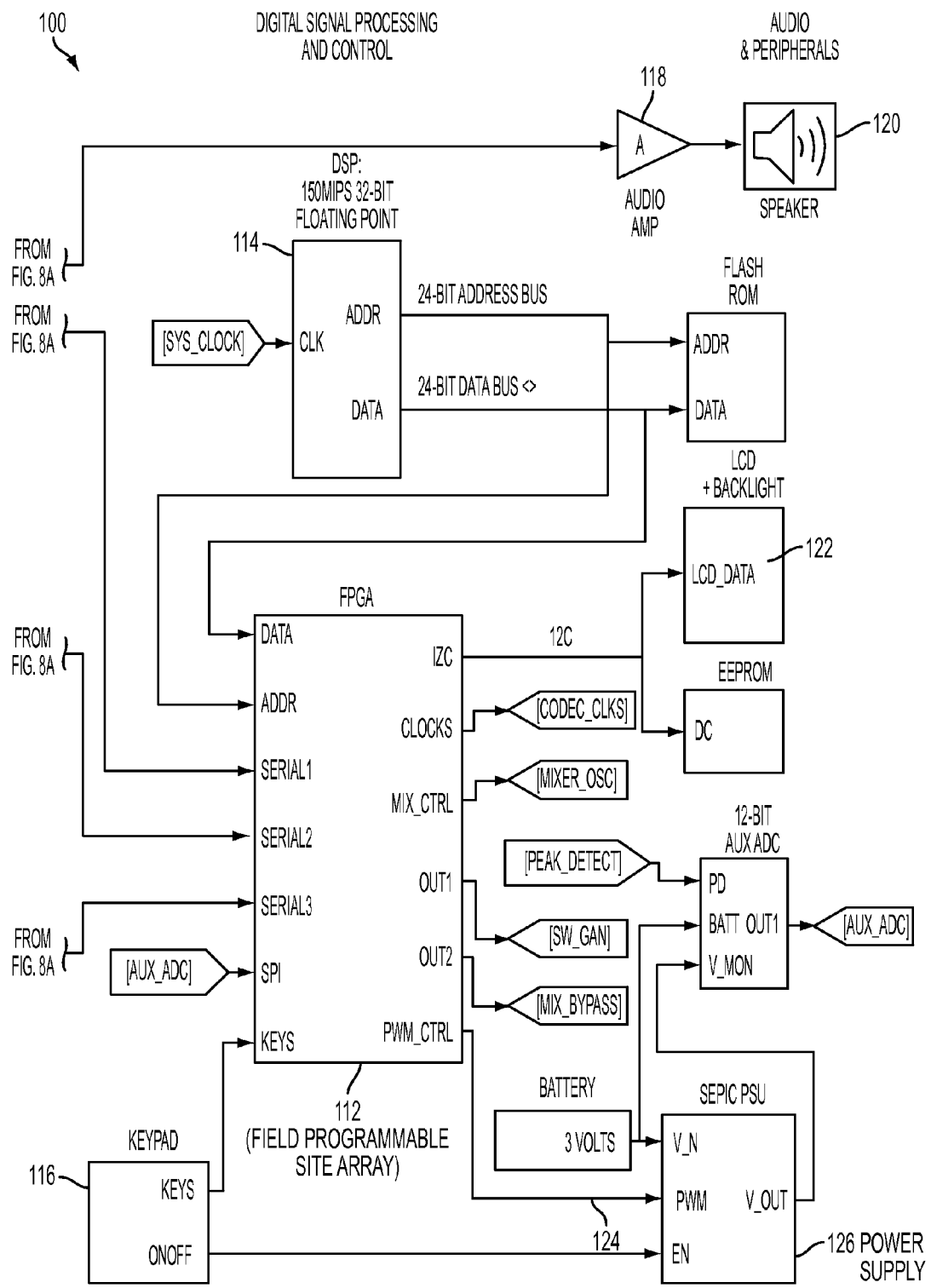

FIG. 8 shows a block diagram of a locator 100 according to an embodiment of the present invention. The magnetic field detectors described in relation to FIG. 7 provide the inputs to the signal processing shown in FIG. 8. The analogue signals from the antennas are fed into switched gain pre-amplifiers 104. The outputs of the pre-amplifiers 104 are then optionally processed by narrow-band heterodyne mixers 106 which down-convert the signals to a lower intermediate frequency that is within the sampling range of the ADCs in delta sigma stereo CODECs 110. Delta sigma stereo CODECs 110 convert the analogue signals into digital signals. Switches 108 select the analogue signals to be routed to delta sigma stereo CODECs 110 either directly or via narrow-band heterodyne mixers 106. The digital signal outputs from the delta sigma CODECs 110 are received by field programmable gate array 112. This buffers the digital signals allowing them to be read by digital signal processor 114. The operation of the locator 100 can be controlled by a user using keypad 116. The locator can provide audible indications to a user by converting a digital signal produced by DSP 114 to an analogue audio signal in CODEC 110, amplifying this by means of amplifier 118 connected to a speaker 120. The locator can also provide indications to a user using display 122. The locator is powered by battery 124 which is connected to power supply 126. Power supply 126 can provide the voltages required by the components of the locator 100. Spectral artifacts produced by the PWM process can be radiated by components of power supply 126. If not carefully managed, these spectral components can appear within the bandwidth of detection of the field detectors and filtering resulting in interference. Such interference is prevented by the managed power supply system described in more detail in U.S. Pat. No. 7,403,012, the content of which is incorporated herein by reference in its entirety.

In use, the signals from the antenna coils T, Vt, M90, $V_b$ and B are amplified by preamplifier stage 104, optionally frequency-shifted by narrow band heterodyne mixers 106 and converted into digital signals by delta sigma CODECs 110. On the basis of these signals, digital processor 114 performs calculations on the signals and calculates the distances and orientations of concealed conductors. DSP 114 controls via field programmable gate array 112 the signal sent to speaker 120 and display 122 to provide a user with audible and visual indications of the location of the concealed conductor.

Figure 9:
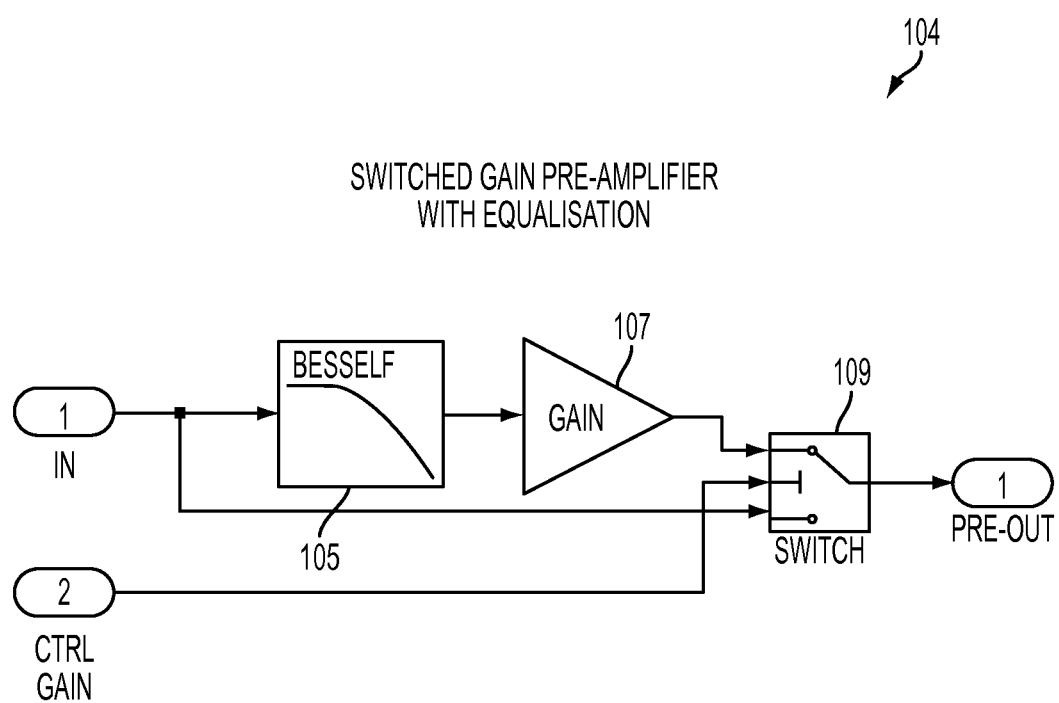
FIG. 9 shows the preamplifier stage of the locator shown in FIG. 8.

FIG. 9 shows the preamplifier stage 104 in more detail. If the signal detected by antennas is weak, the analogue output IN from each of the antennas is fed through an equalization filter 105 and amplified by amplifier 107; otherwise the outputs from the antennas are fed directly into the next stage of the circuit. Switch 109 selects whether the signals are amplified according to control signal CTRL GAIN.

Figure 10:
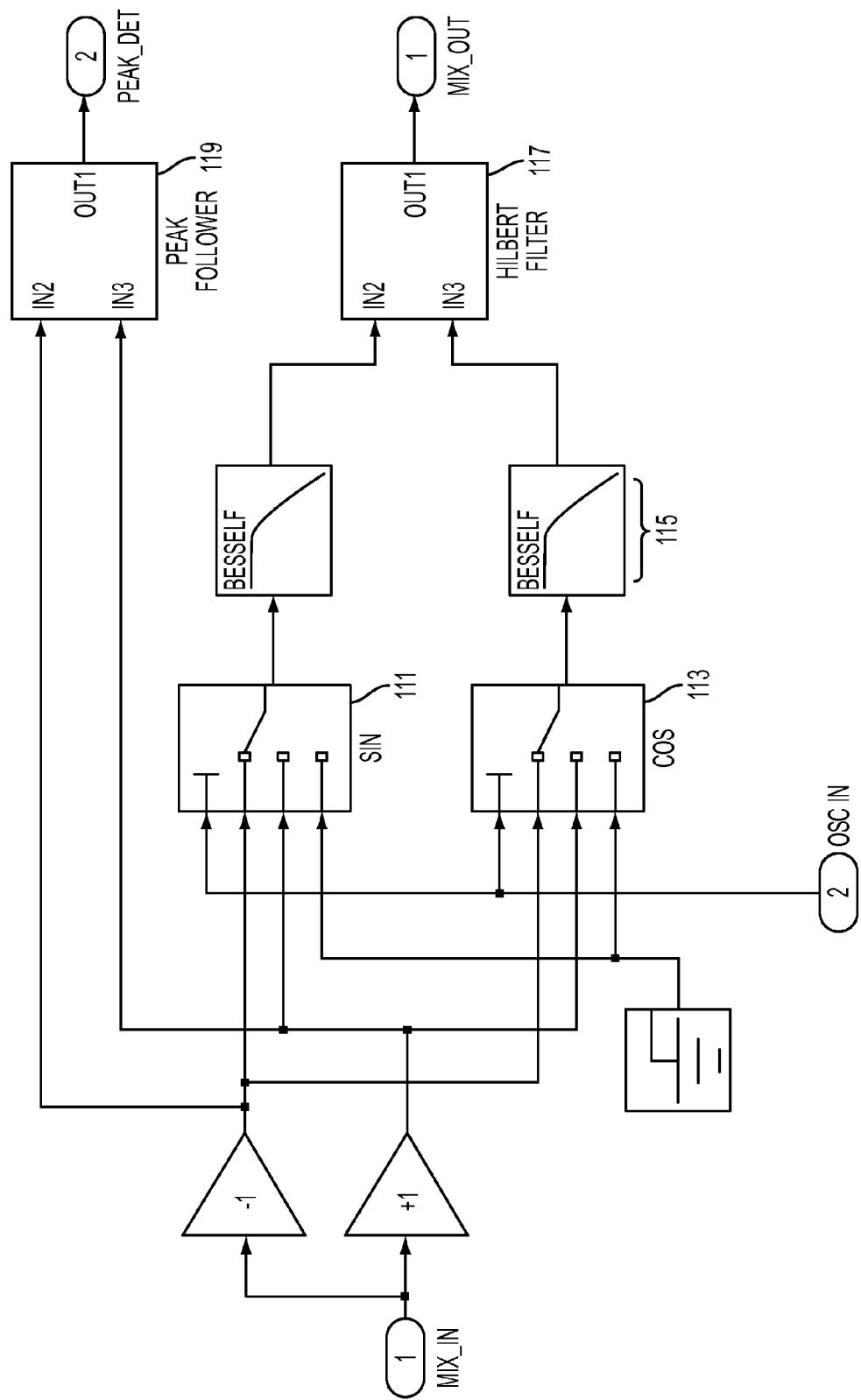
FIG. 10 shows the heterodyne mixers of the locator shown in FIG. 8.

FIG. 10 shows the heterodyne mixers 106 in more detail. The heterodyne mixers 106 act to frequency shift the incoming signals. This is achieved using cosine 113 and sine 111 operators and Hilbert filter 117. Peak follower 119 is used to manage switchable gain to increase the dynamic range of the system. Gain can be added in the analogue part of the signal processing and compensated for later in the digital signal processing.

Figure 11:
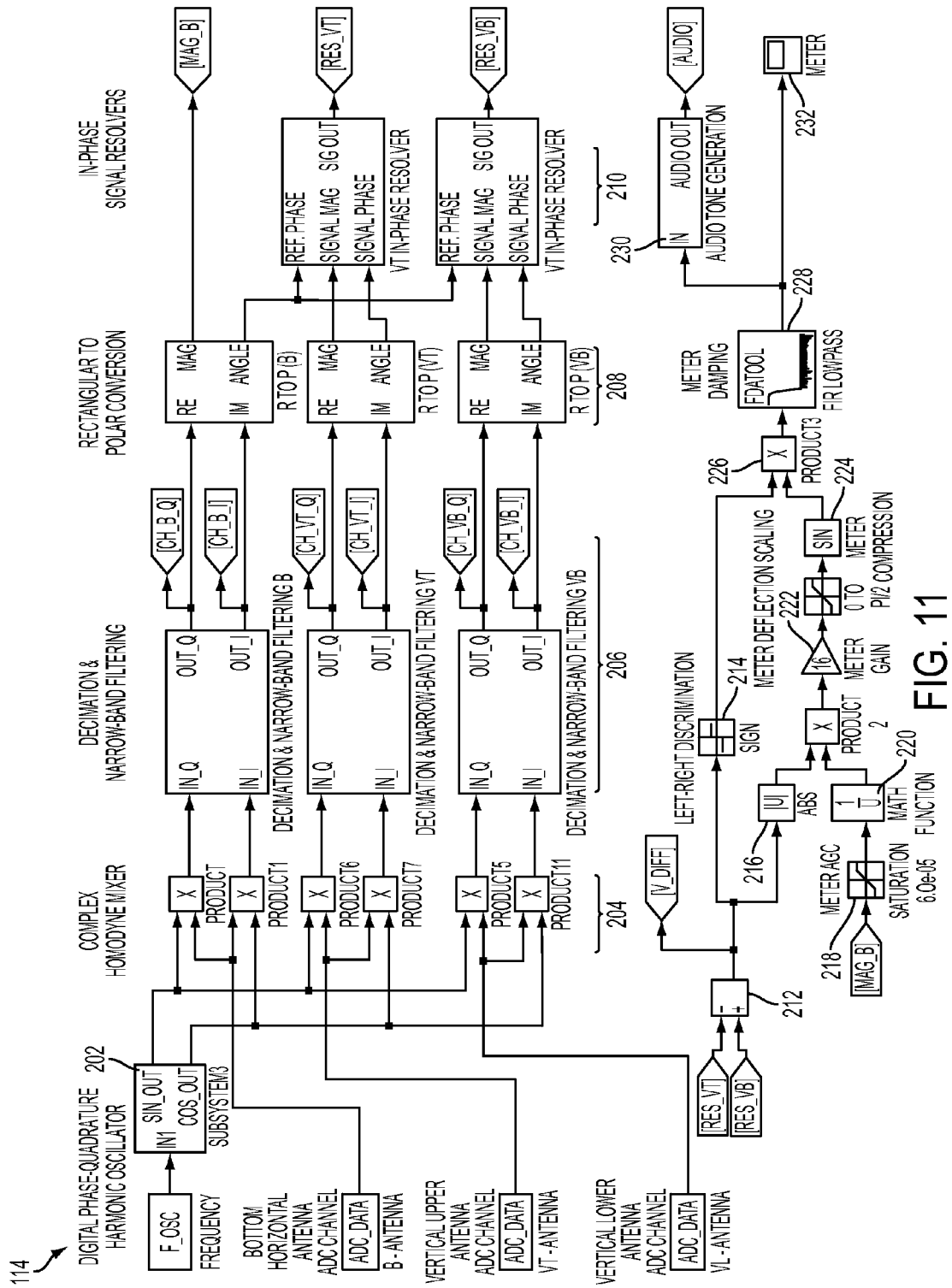
FIG. 11 shows the digital signal processing architecture that is implemented in digital signal processor in an embodiment of the present invention.

FIG. 11 shows the digital signal processing architecture that is implemented in digital signal processor 114 to calculate a left-right indication for a hidden conductor. The inputs to the system are the output digital signals from the delta sigma stereo CODECs 110 shown in FIG. 8. The inputs are three channels, one from the bottom horizontal antenna B and one from the vertical upper antenna channel VT and one from the vertical lower antenna channel VL. A digital phase quadrature harmonic oscillator 202 is implemented within the digital signal processing architecture. The digital phase quadrature harmonic oscillator 202 outputs a sine signal and a cosine signal. The digital phase quadrature harmonic oscillator may generate iterations of sine and cosine values and use the values calculated in previous iterations as negative feedback terms in synthesizing the next sine and cosine values. Such a digital phase quadrature oscillator is described in U.S. Pat. No. 6,642,796, the content of which is incorporated herein by reference in its entirety. The sine and cosine signals are multiplied by the input channels from the antenna in complex homodyne mixer 204.

The complex homodyne mixer multiplies the sampled input signal by sampled sine and cosine functions produced by the digital phase quadrature oscillator 202. The resulting in-phase (I) and phase-quadrature (Q) signals are each lowpass filtered to remove the sum components and unwanted noise received by the field detectors, to extract the wanted transmitter signal received from the concealed conductor. Filtering the I and Q sub-channel signals is accomplished by means of convolved sinc decimators 207 and 209 to effect down-sampling, followed by narrow-bandwidth FIR lowpass filters 211. Such a convolved sinc decimator is described in U.S. Pat. No. 6,968,296, the content of which is incorporated herein by reference in its entirety.

The filtered I and Q signal components constitute an analytic signal that encodes both the magnitude of the signal and its phase angle relative to that of the digital phase-quadrature oscillator 202. The magnitude and phase values are readily obtained from the filtered I and Q signal components by simple trigonometry. This task is accomplished by rectangle-to-polar conversion systems 208.

The phase angles of all the analytic signals in the system precess at a common rate that depends on the difference between the frequency of the phase-quadrature oscillator 202 and the frequency of the signals received by the field detectors. There may be differences between the phase angles of the individual signals depending on the signals received by the field detectors. For example, when the bottom vertical coil traverses through the position of zero response above the concealed conductor the phase angle of its signal abruptly changes by $\pi$ radians (180 degrees).

If the bottom vertical field detector receives predominantly the signal from a second conductor, it is possible for this signal to be in phase-quadrature with respect to the signal received in the bottom horizontal field detector from the target conductor. This can occur where there is little or no conductive current path between the target and second conductors, where the signal current in the target conductor induces a secondary signal by electromagnetic induction due to their mutual inductance. Alternatively, if the conductors are in close proximity, for example in a conduit, there can be capacitive coupling of the signal current from the first conductor to the second conductor. In both cases the secondary current in the second conductor is ($\pi/2$) radians (90 degrees) out of phase with respect to that in the target conductor. This phenomenon is known as signal bleedover.

If either or both vertical field detectors receive a bleedover signal from a second conductor, the vertical difference signal will fail to fall to zero as the locator traverses the target concealed conductor. It is therefore desirable to eliminate bleedover signals in the locator. The bottom horizontal field detector is coupled maximally to the concealed target cable and minimally to a second conductor.

A high degree of bleedover signal rejection in the locator is desirable. In a preferred embodiment this is achieved by resolving the signal components in each signal channel with respect to a reference signal that is in phase with the signal received from the concealed target conductor. The signal from the bottom horizontal field detector is minimally influenced by bleedover signals that are typical encountered, so this is the ideal signal reference.

The outputs from complex homodyne mixer 204 are then subjected to decimation and narrow-band filtering 206. The signals are then subjected to rectangular to polar conversion 208. The output of this step is an angle and a magnitude. ANGLE is the phase angle between the phase of the oscillator 202 and the phase of the inputs from the channels. If the frequency of the oscillator does not exactly match the frequency of the channels, the phase angle will rotate. In-phase signal resolvers 210 then determine the portion of the vertical upper and vertical lower antenna channels that is in phase with the horizontal bottom antenna channel. This means that the following calculations are made on the in-phase components of the vertical upper and lower antenna channels.

The difference between the in-phase components is calculated by subtractor 212. The result of the subtraction is the V_DIFF. This quantity is used for left-right discrimination and also to determine the lateral distance between the locator and the concealed conductor. Based on the sign of V_DIFF, left-right discrimination 214 determines whether the conductor is located to the left laterally or to the right laterally of the locator. The absolute value of V_DIFF is calculated in absolute value 216. The magnitude of the signal of the bottom horizontal antenna is used to normalize the absolute value of V_DIFF. MAG_B is subjected to saturation 218 to avoid divide-by-zero errors and then a reciprocal is calculated in 220. The reciprocal is multiplied by the absolute value of V_DIFF to give an adjusted deflection. This is then amplified in amplifier 222 and converted to a value between 0 and pi/2 before being subjected to meter compression 224. This result is then given a sign according to the result of the left-right discrimination 214 by product 226. Meter damping 228 then subjects the result to low pass filtering to remove any high frequency jitter. The output is then sent to audio tone generation 230 and meter 232.

Figure 12:
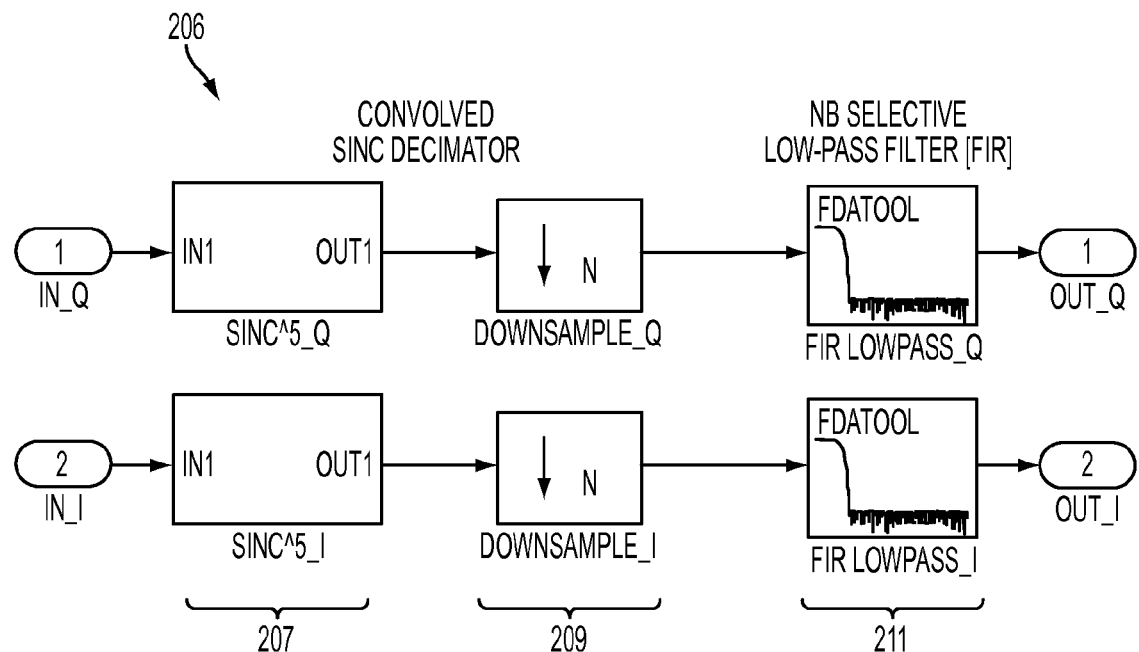
FIG. 12 shows the decimation and narrow band filtering stages of the digital signal processing architecture shown in FIG. 11.

FIG. 12 shows the decimation and narrow band filtering stages in more detail. The I and Q components are subjected to sinc decimation 207 and then down-sampled 209. The down-sampled signal is then subjected to low pass filtering 211.

Figure 13:
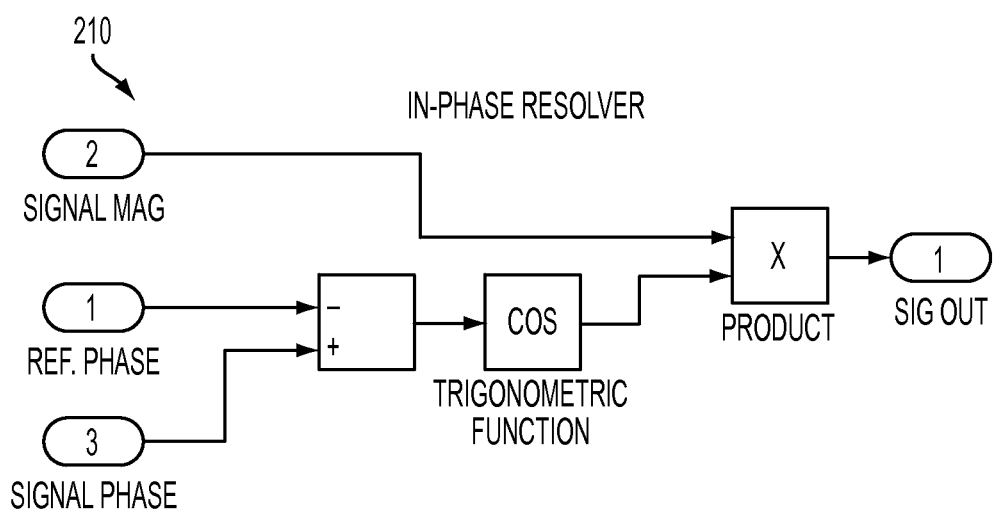
FIG. 13 shows an in-phase resolver of the digital signal processing architecture shown in FIG. 11.

FIG. 13 shows in-phase resolver 210 shown in FIG. 11 in more detail. The in-phase resolver 210 first calculates the phase difference between the signal phase input and the reference phase input. This represents the phase difference between the signal received by a field detector and the reference signal received by the bottom horizontal field detector. This phase difference is zero when these are fully in phase, and ($\pi/2$) radians (90 degrees) out of phase corresponding to a pure bleedover signal being received. Multiplying the cosine of the phase difference by the magnitude of the input signal gives a signed signal amplitude value representing the input signal component resolved in phase with the reference signal. Therefore bleedover signals are rejected by the in-phase resolver 210.

The resulting signals, having been phase-referenced, contain only amplitude and polarity information. This simplifies the task of determining the lateral displacement of the locator from the concealed target conductor.

Figure 14:
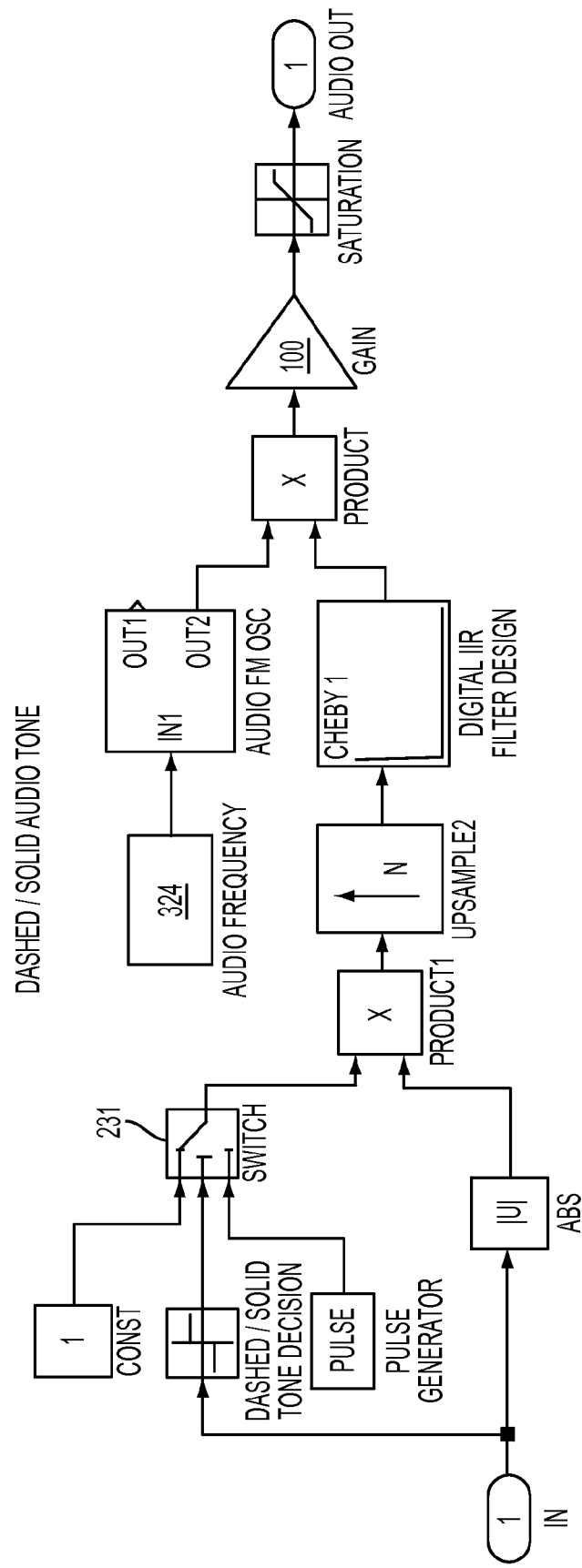
FIG. 14 shows the generation of the audio tone signals in the digital signal processing architecture shown in FIG. 11.

FIG. 14 shows the generation 230 of the audio tone signals in more detail. Switch 231 selects between the output of a pulse generator and a solid tone depending on the sign of the left/right discrimination signal. This signal is then multiplied by the absolute value of the output of meter damping 228. This signal is then up-sampled, digitally filtered and combined with an audio frequency signal. The audio out signal is either a constant tone or pulsed signal depending on whether the target conductor is located to the right or the left of the locator and the volume of the signal increases the further the locator is from the target conductor. This gives the user an audio indication of the location of the null field that would occur when the locator is located over a concealed conductor.

To aid location of the target conductor it is desirable to indicate to the operator the lay direction of the target conductor relative to the locator. An indication of the degree of rotation of the locator about its primary vertical axis relative to the axis of the target conductor may be calculated from the signals derived from the bottom horizontal field detector B and a mutually orthogonal field detector for example M90 in the arrangement shown in FIG. 7.

The angle subtended between the magnetic axis of the bottom horizontal field detector B and the axis of the target conductor may be determined by calculating the arctangent of the ratio of the magnitude of the bottom horizontal field detector B signal to the magnitude of the orthogonal horizontal field detector signal M90.

Alternatively, the angle subtended between the magnetic axis of the orthogonal horizontal field detector M90 and the axis of the target conductor may be determined by calculating the arctangent of the ratio of the magnitude of the orthogonal horizontal field detector signal M90 to the magnitude of the bottom horizontal field detector B signal.

In either arctangent calculation the magnitude may be replaced by the signed amplitude indicative of the relative polarity of the M90 signal to the B signal, in which case the 4-quadrant a tan 2 function returns the correct angle. If unsigned magnitudes are used the phase of the M90 signal relative to the B signal must be taken into account when determining in which quadrant the computed angle lies.

In an embodiment the resolved M90 signal component that is in phase with the reference B signal is used in the 4-quadrant arctangent calculation. This improves the accuracy of the angular indication in the presence of bleedover signals.

Various modifications will be apparent to those in the art and it is desired to include all such modifications as fall within the scope of the accompanying claims.

The signal processing to arrive at the difference signal between the top and bottom vertical magnetic field sensors may be implemented a different order to that described above. For example, provided that phase and amplitude information of the difference signal are retained, the subtraction may be calculated before the in-phase components are determined.

The subtraction may be implemented as an analogue subtraction of the signals from $V_t$ and $V_b$, prior to digitization. This has the advantage of saving one ADC channel compared to the embodiment described in reference to FIGS. 8 to 14 above. If the subtraction is implemented on the analogue signals, calibration may require trimming during manufacture to correct for gain imbalances in the sensors and electronics, by adjusting the relative gains of the analogue signal paths carrying the $V_b$ and $V_t$ signals.

Further, the subtraction may be implemented in the digital domain in the processing before the in-phase component with respect to the signal from the reference magnetic field detector is calculated. For example, the subtraction may be implemented in the digital domain of the sampled-data signals from $V_t$ and $V_b$ following A/D conversion, prior to homodyne mixing. In a further possible implementation, the subtraction is carried out as a complex subtraction in the digital domain of the analytic signals deriving from $V_t$ and $V_b$ following homodyne mixing, either prior to decimation, or prior to narrow-band filtering, or following narrow-band filtering.

In all the above alternative embodiments the vertical difference signal is calculated prior to the in-phase resolving step. In these alternative embodiments, the in-phase resolving step calculates the signal component of the vertical difference signal that is in phase with the reference signal.

In embodiments where the subtraction is performed in the digital domain, digital gain may be readily applied to correct for gain imbalances in the sensors and electronics to calibrate the system. The required digital gain to calibrate the system can be determined during manufacture in a calibration process that can be automated.

The digital domain signal processing may be implemented in FPGA, DSP or microcontroller devices, or split across some combination of the aforementioned devices.

Aspects of the present invention can be implemented in any convenient form, for example using dedicated hardware, or a mixture of dedicated hardware and software for the processing of the signals. The processing apparatuses can comprise any suitably programmed apparatuses such as a general purpose computer, personal digital assistant, mobile telephone (such as a WAP or 3G-compliant phone) and so on. Since the processing of the present invention can be implemented as software, each and every aspect of the present invention thus encompasses computer software implementable on a programmable device. The computer software can be provided to the programmable device using any conventional carrier medium. The carrier medium can comprise a transient carrier medium such as an electrical, optical, microwave, acoustic or radio frequency signal carrying the computer code. An example of such a transient medium is a TCP/IP signal carrying computer code over an IP network, such as the Internet. The carrier medium can also comprise a storage medium for storing processor readable code such as a floppy disk, hard disk, CD ROM, magnetic tape device or solid state memory device.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

What is claimed is:

1. A locator for determining the location and/or orientation of a concealed conductor, comprising:
    a reference field detector that detects an alternating magnetic field along a reference axis;
    a first field detector orthogonal to the reference field detector and that detects an alternating magnetic field along a first axis;
    a second field detector parallel to the first field detector and orthogonal to the reference field detector, that detects an alternating magnetic field along the first axis; and
    a processor programmed to calculate an in-phase component of a signal detected by the first and second field detectors, wherein the in-phase component is in-phase with a signal detected at the reference field detector, and to calculate and output an indication of a position and/or orientation of the concealed conductor relative to the locator using at least the in-phase component of the signal detected by the first and second field detectors,
    wherein the first and second field detectors are configured to minimize interference from sources other than the concealed conductor.

2. The locator according to claim 1, further comprising a reference oscillator, wherein the processor is further programmed to calculate vectors representing the signals from the reference field detector and first and second field detectors, and to calculate a projection of the vector from the first and second detectors onto the vector from the reference oscillator as an in-phase component.

3. The locator according to claim 1, wherein the first axis is parallel to the reference axis, the first and second field detectors and the reference field detector are spaced apart, and the processor is programmed to calculate the distance between the concealed conductor and the locator.

4. The locator according to claim 1, wherein the first axis is at an angle to the reference axis, and the processor is programmed to calculate and output an indication of the degree of rotation of the reference axis relative to an axis of the concealed conductor.

5. The locator according to claim 4, further comprising a further field detector that detects an alternating magnetic field along a further axis, wherein the further axis is parallel to the reference axis, the further field detector and the reference field detector are spaced apart, and the processor is programmed to calculate and output an indication of the distance between the concealed conductor and the locator.

6. The locator according to claim 1, wherein the first axis is at an angle to the reference axis, and the processor is programmed to calculate and output an indication of a lateral position of the conductor relative to the first axis.

7. The locator according to claim 1, further comprising an indicator for providing an indication of the position and/or orientation of the concealed conductor using the calculated indication of the position and/or orientation of the concealed conductor relative to the locator.

8. The locator according to claim 1, wherein an output of the reference field detector is used to determine a polarity of a difference signal of outputs of the first and second field detectors.

9. A method of determining the location and/or orientation of a concealed conductor, comprising:
    measuring a reference magnetic field along a reference axis;
    measuring a first magnetic field along a first axis;
    measuring a second magnetic field along the first axis;

calculating an in-phase component of the first and second magnetic fields, the in-phase component being in phase with the reference magnetic field; and calculating position and/or orientation information of the concealed conductor using at least the in-phase component of the first and second magnetic fields.

10. The method according to claim 9, wherein the first axis is parallel to the reference axis, and the position information comprises a distance between the reference axis and the concealed conductor.

11. The method according to claim 9, wherein the first axis is at an angle to the reference axis and the position information comprises a lateral position of the conductor relative to the first axis.

12. The method according to claim 11, wherein the first axis is orthogonal to the reference axis.

13. The method according to claim 12, further comprising measuring a second magnetic field along a second axis, wherein the second axis is parallel to the first axis, and wherein the first axis and the second axis are orthogonal to the reference axis, and the position information comprises a lateral distance between the first axis and the concealed conductor.

14. The method according to claim 9, wherein the first axis is at an angle to the reference axis, and the orientation information comprises an indication of the degree of rotation of the reference axis relative to an axis of the concealed conductor.

15. The method according to claim 14, wherein the first axis is orthogonal to the reference axis.

16. The method according to claim 9, further comprising generating an oscillating reference signal, calculating the phase of the reference field with respect to the oscillating reference signal, calculating the phase of the first magnetic field with respect to the oscillating reference signal, and determining the in-phase component from the calculated phases and magnitudes of the reference magnetic field and the first magnetic field.

17. The method according to claim 9, wherein the measuring a first magnetic field along a first axis and the measuring a second magnetic field along the first axis steps further comprise minimizing the interference from sources other than the concealed conductor.

18. A non-volatile carrier medium storing computer readable instructions for execution by a processor in a locator for locating and/or determining orientation of a concealed conductor, the locator having a reference field detector that detects an alternating magnetic field along a reference axis;
a first field detector that detects an alternating magnetic field along a first axis;
a second field detector that detects an alternating magnetic field along a first axis;
wherein the instructions comprise instructions for controlling the processor to calculate an in-phase component of signals detected by the first and second field detectors, the in-phase component of the signals detected by the first and second field detectors being in phase with a signal detected at the reference field detector and to calculate a signal indicative of a position and/or orientation of the concealed conductor relative to the locator using at least the in-phase component detected by the first and second field detectors.

19. The carrier medium according to claim 18, wherein the instructions further comprise instructions for calculating the phase of the reference field with respect to a oscillating reference signal, calculating the phase of the first magnetic field with respect to the oscillating reference signal, and determining the in-phase component from the calculated phases and magnitudes of the magnetic field along the reference axis and the magnetic field along the first axis.

20. The carrier medium according to claim 18, wherein the instructions further comprise instructions to minimize the interference from sources other than the concealed conductor.

* * * * *